United States Patent
Tsuzuki et al.

(10) Patent No.: US 6,586,270 B2
(45) Date of Patent: Jul. 1, 2003

(54) PROCESS FOR PRODUCING A PHOTOVOLTAIC ELEMENT

(75) Inventors: Kouji Tsuzuki, Nara-ken (JP); Tsutomu Murakami, Nara-ken (JP); Kouichi Shimizu, Kyoto-fu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/870,659

(22) Filed: Jun. 1, 2001

(65) Prior Publication Data

US 2002/0016016 A1 Feb. 7, 2002

(30) Foreign Application Priority Data

Jun. 1, 2000 (JP) ........................................ 2000-163911

(51) Int. Cl.[7] .............................................. H01L 21/00
(52) U.S. Cl. ........................... 438/57; 438/58; 438/612; 136/256
(58) Field of Search ........................... 438/57, 58, 612; 136/256

(56) References Cited

U.S. PATENT DOCUMENTS

| 5,681,402 | A | | 10/1997 | Ichinose et al. | ............ | 136/256 |
| 5,942,048 | A | | 8/1999 | Fujisaki et al. | ............. | 136/256 |
| 6,008,451 | A | * | 12/1999 | Ichinose et al. | ............ | 135/256 |
| 6,010,769 | A | * | 1/2000 | Sasaoka et al. | ............. | 428/209 |

FOREIGN PATENT DOCUMENTS

JP   8-236796   9/1996

OTHER PUBLICATIONS

09/717,238 filed Nov. 22, 2000, Shimizu, K., et al.

* cited by examiner

*Primary Examiner*—T. N. Quach
(74) *Attorney, Agent, or Firm*—Fitzpatrick, Cella, Harper & Scinto

(57) ABSTRACT

A process for producing a stable photovoltaic element having an electrode structure comprising a collecting electrode and a metal bus bar which are connected to have an improved connection between them. Said electrode structure is formed by dotting an electrically conductive paste onto a metal wire as the collecting electrode such that a dotted electrically conductive paste has an elliptical form whose major axis and minor axis are respectively perpendicular to and parallel to a lengthwise direction of said metal wire, arranging the metal bus bar on said dotted electrically conductive paste, and heating the resultant while pressing it to cure the electrically conductive paste to form connection between the metal wire as the collecting electrode and the metal bus bar.

6 Claims, 8 Drawing Sheets

(a)

(b) EXPLODED A PORTION (a)

F I G. 7
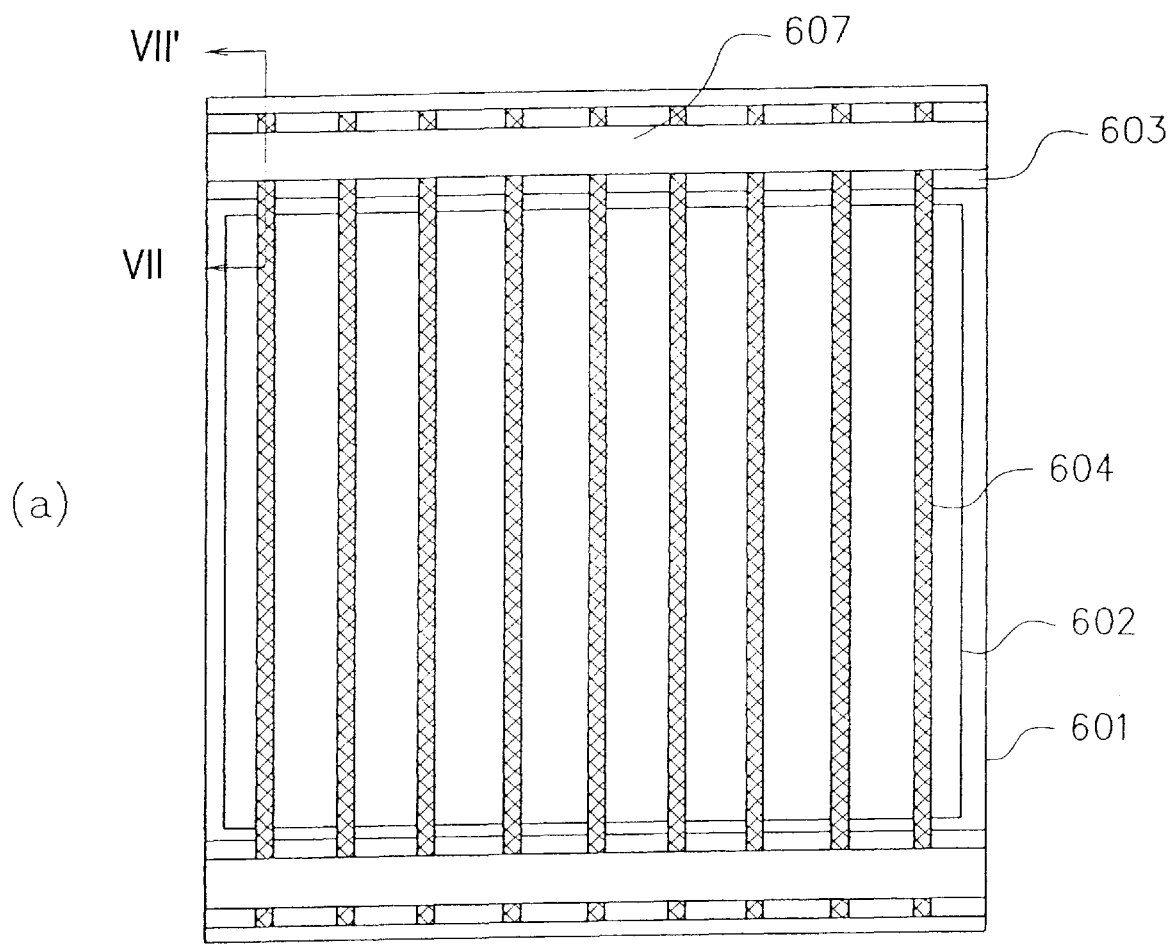
(a)
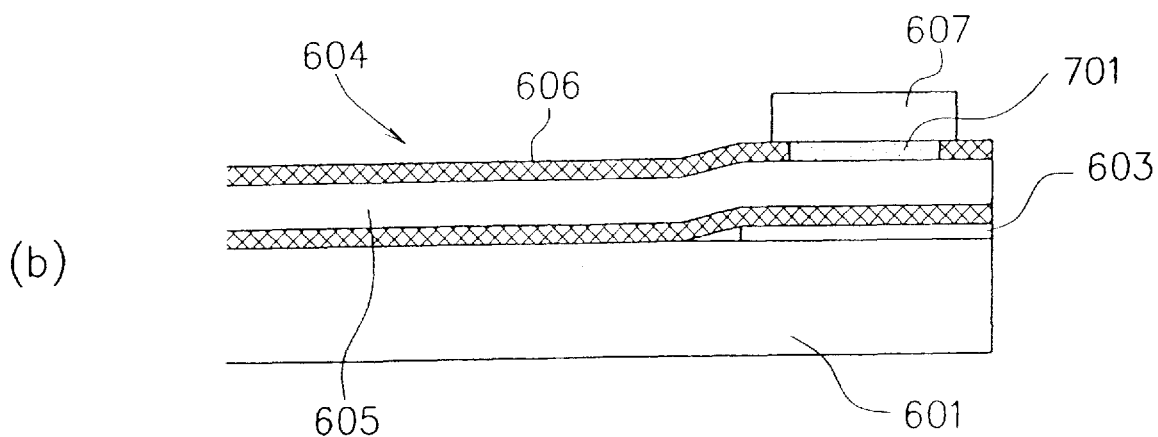
(b)

(a) PRIOR ART (b) PRIOR ART

PROCESS FOR PRODUCING A PHOTOVOLTAIC ELEMENT

BACKGROUND OF THE INVENTION

1. Field of the Invention

The present invention relates to a process for producing a photovoltaic element. More particularly, the present invention relates to a process for producing a photovoltaic element having an improved electrode structure.

2. Related Background Art

Solar cells in which photovoltaic elements are used are attracting attention because they are able to replace conventional electric power generation such as thermal and hydraulic power generation.

There are known a variety of solar cells, such crystalline series solar cells, amorphous series solar cells, and compound semiconductor series solar cells, which are under development or used in practice. Of these solar cells, an amorphous silicon solar cell has many advantages over a crystalline silicon solar cell despite the former is inferior to the latter in terms of the photoelectric conversion efficiency. That is, the amorphous silicon solar cell has a high light absorption coefficient, it works in the form of thin film, and it can be readily made have a large area. Therefore, it is the most promising type of solar cell.

As known well, the amorphous silicon solar cell is constructed of an electrically conductive substrate of stainless steel or the like and layers of back electrode, semiconductor, and light-receiving electrode which are sequentially formed on the substrate. The light-receiving electrode is formed of a transparent conductive oxide.

On the surface of the light-receiving electrode is arranged a collecting electrode comprising fine metal wires for collecting electric current. Being arranged on the light incident side, the collecting electrode casts a shadow on the light receiving face, thereby reducing the active area that contributes to power generation by the solar cell. For this reason, it is a common practice to make the current collecting electrode to be in a thin comb-shaped form. Therefore, the collecting electrode is necessary to be formed by a material with a low electrical resistance such that it has a thin, long form and a cross section which reduces electrical resistance.

Moreover, on the collecting electrode, a so-called bus-bar electrode is formed in order to collect current which is collected by the collecting electrode. The bus-bar electrode is formed of a metal which is thicker than the collecting electrode.

As an example of such an electrode, Japanese Laid-open Patent application No. Hei 8-236796 discloses a collecting electrode formed using metal wires. FIGS. 6(a) and 6(b) are schematic views illustrating an example of the structure of said collecting electrode. Particularly, FIG. 6(a) is a schematic plan view of a photovoltaic element having said collecting electrode, and FIG. 6(b) is a schematic cross-sectional view taken along the line VI–VI' in FIG. 6(a).

In FIGS. 6(a) and 6(b), reference numeral 601 indicates a photovoltaic element comprising a back electrode layer, a semiconductor layer, and a transparent electrode layer sequentially formed on a substrate of stainless steel. Reference numeral 602 indicates an etching line along which the transparent electrode layer is removed so as to prevent the photovoltaic element from being short-circuited at its edge. The etching line 602 surrounds an active area of the photovoltaic element which contributes to power generation. Reference numeral 603 indicates an insulating material 603 and reference numeral 604 a collecting electrode. The collecting electrode 604 comprises a metal wire 605 (50 to 300 $\mu$m in diameter) coated with an electrically conductive paste 606 or the like, which is press-bonded to the transparent electrode layer. The electrically conductive paste has a resistivity of $10^{-1}$ to $10^2$ $\Omega$cm so that it does not cause short-circuiting (which decreases output) in case of direct contact with pinholes in the surface of the photovoltaic element and it prevents metal migration. Reference numeral 607 indicates a bus-bar electrode for additional current collection, which serves to collect current collected by the collecting electrode 604 and output it outside the photovoltaic element.

The conventional solar cell having such structure as above mentioned has a photoelectric conversion efficiency of 8 to 10% in practice. There has been a remarkable improvement in the photoelectric conversion efficiency for solar cells. Particularly, there recently has developed a semiconductor film having an improvement in terms of the short-circuit current (Isc) and having a photoelectric conversion efficiency of more than 10%.

However, in the case where the photoelectric conversion efficiency and the quantity of current is increased, there is a problem such that the loss of generated electric power at the electrode through which current flows increases in proportion to the square of the quantity of current. In other words, even when a high-efficiency semiconductor should have been developed, there is a tendency in that the practical photoelectric conversion efficiency is considerably lowered on account of the loss that occurs at a high-resistance part when generated current is led to the external circuit. Therefore, it is necessary for the solar cell to consider an adequate current collecting type in accordance with the quantity of current generated.

The collecting electrode disclosed in the above-mentioned Japanese Laid-open Patent Application No. Hei 8-236796 is constructed such that the junction of the bus-bar electrode and the wire electrode is formed with a carbon paste (which has a comparatively high resistivity) and hence has a high resistance. The solar cell with such a collecting electrode does not secure the desired photoelectric conversion efficiency because the resistance loss at the junction increases as the quantity of current increases.

One possible way to address this problem is to form the junction of the bus-bar electrode and the wire electrode with an electrically conductive paste or the like having a low resistance, thereby reducing the resistance loss.

An example of the photovoltaic element based on such an idea is schematically shown in FIGS. 7(a) and 7(b). FIG. 7(a) is a schematic plan view of the photovoltaic element and FIG. 7(b) is a schematic cross-sectional view taken along the line VII–VII' in FIG. 7(a).

The configuration of the photovoltaic element shown in FIGS. 7(a) and 7(b) differs from that of the photovoltaic element shown in FIGS. 6(a) and 6(b) in that the carbon paste at the junction of the metal wire 605 and the bus-bar electrode 607 is replaced by an electrically conductive paste 701 (such as silver paste) having a low resistance. The silver paste whose resistivity is about one-thousandth of that of carbon paste greatly reduces the resistance loss and permits the photovoltaic element to have a desired photoelectric conversion efficiency.

The photovoltaic element shown in FIGS. 7(a) and 7(b) is liable to have such problems as will be described below with reference to FIGS. 8(a) and 8(b).

FIG. 8(a) shows an appearance of the electrically conductive paste 701 with low-resistance which has been "dotted". FIG. 8(b) shows an appearance of the electrically conductive paste 701 which has been pressed and heat-cured under the metal bus-bar.

Any known dispenser may be used to make a circular dot of silver paste as shown in FIG. 8(a). The round dot is pressed and heat-cured under the metal bus-bar 607 as shown in FIG. 8(b).

The problem with dotting a electrically conductive paste on a metal wire is that the electrically conductive paste flows out along the metal wire when it is heated under pressure as shown in FIG. 8(b). Eventually, the electrically conductive paste is forced out from the metal bus-bar 607.

The electrically conductive paste which has been forced out from the metal bus-bar poses the following problems.

(1) The electrically conductive paste enters the active area surrounded by the etching line 602. It may come into direct contact with pinholes in the surface of the photovoltaic element, causing short-circuiting and impairing the original photoelectric conversion efficiency. Even if this does not happen at first, the electrically conductive paste is subject to metal migration caused by metal filler of the electrically conductive paste after prolonged use and hence is liable to cause short-circuiting. This is true particularly in the case of a thin film solar cell in which the semiconductor film is very thin.

(2) The electrically conductive paste may contaminate the pressing surface of an apparatus for pressing at the time of pressing, and the silver paste which is adhered to the pressing surface needs to be cleansed off after each pressing operation.

One way to prevent the electrically conductive paste from being forced out is to simply reduce the diameter of the silver paste 701 to be applied as shown in FIG. 8(a). This purpose can be achieved by using a dispenser equipped with a round nozzle having a smaller diameter.

However, when the diameter of the applied silver paste is diminished, a problem is liable to entail such that it is difficult to hit the metal wire with the silver paste. In actual operation, dotting is accomplished by means of a dispenser robot which delivers the silver paste at prescribed intervals. Unavoidable errors may creep depending on the positioning accuracy of the wires, elements, and application points. The smaller the dot diameter, the lower the probability that the dot of silver paste hits the wire. There may be an instance in which the silver paste misses the wire. The result is that the metal wire is not completely connected to the metal bus-bar with the electrically conductive paste. This incomplete connection may be detrimental to a desired photoelectric conversion efficiency.

SUMMARY OF THE INVENTION

The present invention has been accomplished in order to address the above-mentioned problems which is unique to utilization of the metal wires.

It is an object of the present invention to provide a method of applying a electrically conductive paste stably regardless of the accuracy of wire positioning without the electrically conductive paste being forced out from the metal bus-bar The method of the present invention contributes to the production of a stable photovoltaic element.

After thorough investigation on the solution of the above-mentioned problems, the present inventors found an optimum process for producing a photovoltaic element.

According to an aspect of the present invention, there is provided a process for producing a photovoltaic element having a collecting electrode comprising a metal wire arranged on the surface of the photovoltaic element and a metal bus-bar, the collecting electrode being connected to the metal bus-bars with an electrically conductive paste. The process comprises the steps of dotting an electrically conductive paste onto the collecting electrode such that a dotted electrically conductive paste has an elliptical form whose major axis and minor axis are respectively perpendicular to and parallel to a lengthwise direction of the metal wire as the collecting electrode, placing the metal bus-bar on the electrically conductive paste, and pressing with heat the metal bus-bar, thereby curing the electrically conductive paste.

According to another aspect of the present invention, the step of dotting is carried out by delivering the electrically conductive paste from an elliptical nozzle.

According to still another aspect of the present invention, the step of dotting is carried out by delivering the electrically conductive paste from the nozzle while moving the nozzle relatively to the photovoltaic element.

According to yet another aspect of the present invention, the collecting electrode comprises a metal wire covered with an electrically conductive coating layer.

According to a further aspect of the present invention, the step of dotting is preceded by a step of removing the electrically conductive coating layer at a prescribed portion thereof where the electrically conductive paste is dotted.

The present invention includes an embodiment in that the electrically conductive paste is composed of a polymer resin and electrically conductive particles.

In the production process to which the present invention is applied, an elliptical dot of the electrically conductive paste has a major axis in the direction perpendicular to the metal wire. Consequently, the electrically conductive past can be applied accurately regardless of the positioning of the metal wire. Hence, the production of the photovoltaic elements with improved stability can be realized. Further, the electrically conductive paste has a minor axis in the direction parallel to the metal wire. Consequently, it is possible to prevent the electrically conductive paste from being forced out from the metal bus-bar. Hence, initial properties and qualities of the photovoltaic element can be improved.

Furthermore, in order to realize the elliptical shape of the dot mentioned above, an elliptical nozzle is utilized. Consequently, dotting can be carried out considerably fast with improved productivity and with an amount of electrically conductive paste to be applied being controlled.

BRIEF DESCRIPTION OF THE DRAWINGS

FIGS. 7(a) and 7(b) are schematic diagrams of a photovoltaic element which employs an electrically conductive paste for junction.

DESCRIPTION OF THE INVENTION AND PREFERRED EMBODIMENTS

The present invention will be described in more detail with reference to the following embodiments.

Elliptical Form and Nozzle

Figure 1:
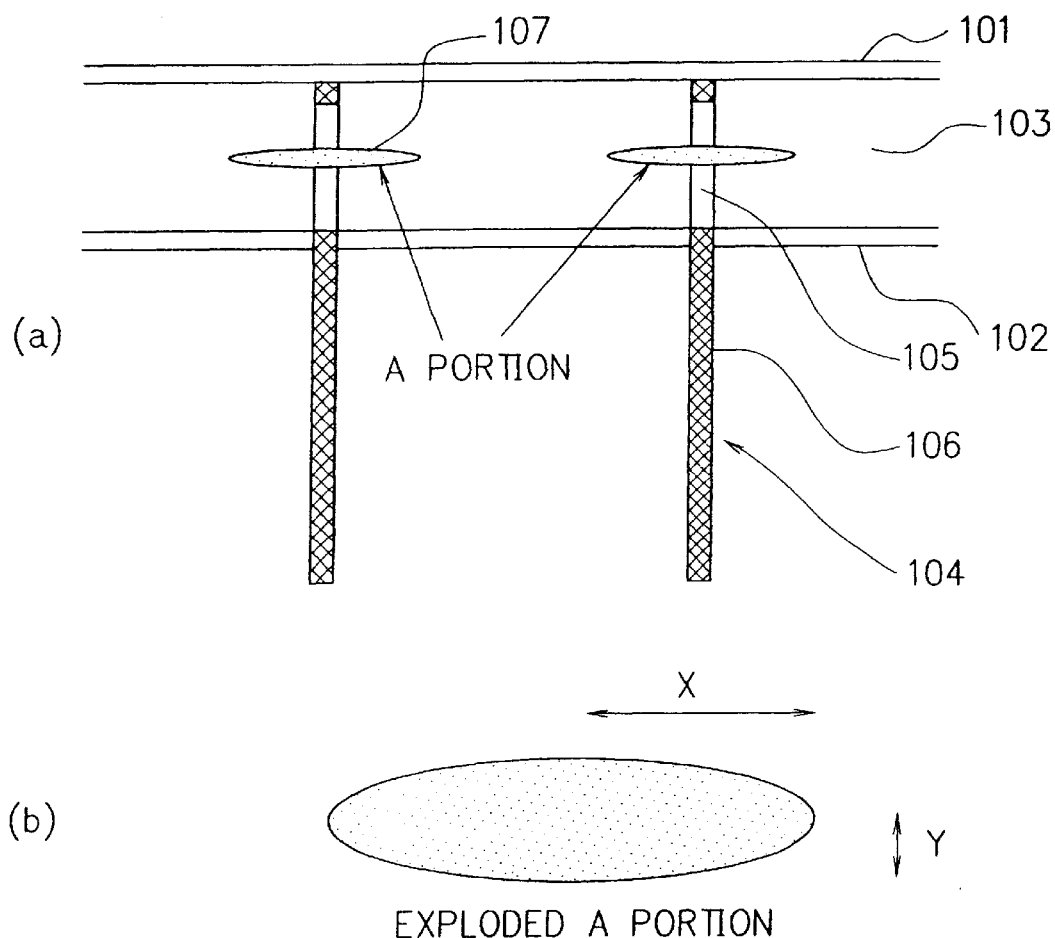
FIGS. 1(a) and 1(b) are schematic diagrams showing elliptical dots in one embodiment of the present invention.

According to the present invention, an electrically conductive paste is dotted in an elliptical form as explained below. FIG. 1(a) is a schematic diagram showing elliptical dotting carried out according to the present invention. FIG. 1(b) is an enlarged view of portion A in FIG. 1(a).

In FIG. 1(a), reference numeral 101 denotes the periphery of a photovoltaic element, reference numeral 102 an etching line, reference numeral 103 an insulating material, reference numeral 104 a collecting electrode comprising a metal wire 105 and an electrically conductive coating layer 106 formed thereon, and reference numeral 107 an electrically conductive paste.

The dot of the electrically conductive paste 107 takes an elliptical form as shown in the enlarged view of FIG. 1(b). The electrically conductive paste 107 is dotted such that the elliptical dot has a major axis in the direction (X) perpendicular to the metal wire and a minor axis in the direction (Y) parallel to the metal wire. Dotting the electrically conductive paste in an elliptical form reduces the amount of the electrically conductive paste which comes into direct contact with the metal wire. This in turn reduces the amount of the electrically conductive paste which flown out along the metal wire (as the collecting electrode). In other words, in this way, it is possible to prevent the electrically conductive paste from being forced out. Preferably, the major axis of the elliptical dot is sufficiently large in the direction perpendicular to the metal wire. Consequently, it is possible to apply the electrically conductive paste to the metal wire regardless of its positioning accuracy.

There is no particular limitation for the absolute values of the major axis and the minor axis and their ratio. They may be adequately selected according to the diameter of the metal wire to be used, the intervals of the metal wires, the width of the insulating material 103, the width of the metal bus-bar to make connection with the metal wire, and the amount of the electrically conductive paste applied.

The elliptical dotting mentioned above can be achieved by using any known dispenser equipped with a properly selected nozzle.

Figure 2:
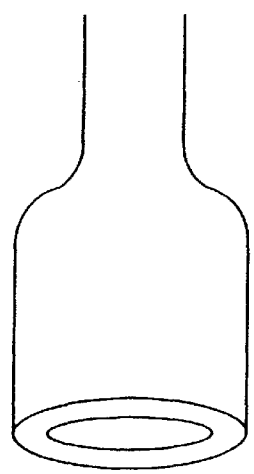
FIG. 2 is a schematic diagram showing an elliptical nozzle favorably used in the present invention.

One way to achieve this purpose is to deliver the electrically conductive paste through a thin round nozzle which moves straight over the photovoltaic element. (Alternatively, the photovoltaic element may be moved instead of the nozzle.) However, application in this manner takes a long time and hence is poor in productivity. In addition, delivery through a round nozzle tends to be excessive because the thickness of the dot is proportional to the nozzle diameter. To tackle this problem, it is desirable to use an elliptical nozzle as shown in FIG. 2.

The elliptical nozzle performs dotting by a single shot, which contributes to productivity. In addition, it delivers an exact amount required because the thickness of the dot does not depend on the nozzle diameter. Therefore, the elliptical nozzle is most suitable for the present invention.

Electrically Conductive Paste

The electrically conductive paste 107 used in the present invention is placed between the metal wire and the metal bus-bar. It functions as a path through which current flows from the metal wire to the metal bus-bar. Preferably, the electrically conductive paste 107 also functions as an adhesive to mechanically bond the metal wire to the metal bus-bar. For this reason it is required for the electrically conductive paste 107 to have a very low resistance and exhibits good adhesion to metal.

The resistivity of the electrically conductive paste should preferably be $1 \times 10^{-5}$ to $1 \times 10^{-3}$ $\Omega$cm or lower so that current flowing through the electrically conductive paste from the metal wire is only subject to negligible power loss.

The electrically conductive paste may be an electrically conductive paste obtained by dispersing electrically conductive particles in a polymer resin at a desired mixing ratio.

There is no particular limitation for the electrically conductive particles so long as they realize the above-mentioned resistivity. Ordinary metal filler composed mainly of gold, silver, nickel, copper, or the like may be used. Silver, nickel, or copper powder is desirable because of low resistivity and low price.

Preferred examples of the polymer resin include polyurethane resin, epoxy resin, phenolic resin, butyral resin, acrylic resin, polyester, etc., which exhibit good adhesion to metal and have good weatherability and moisture resistance.

The electrically conductive paste may be incorporated with an additive such as coupling agent to improve its adhesion to a metal.

Collecting Electrode

Figure 3:
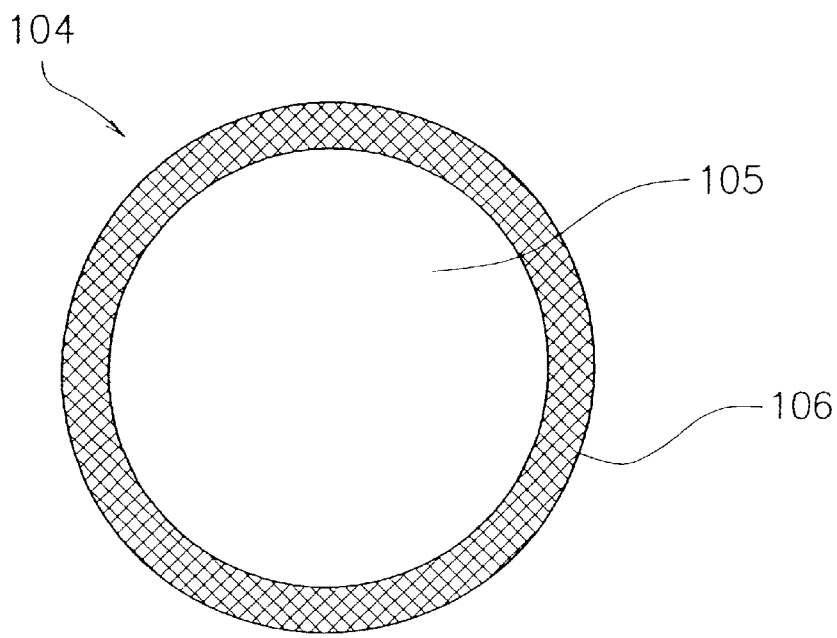
FIGS. 3(a) and 3(b) are schematic sectional views of a collecting electrode in the present invention.
Figure 3:
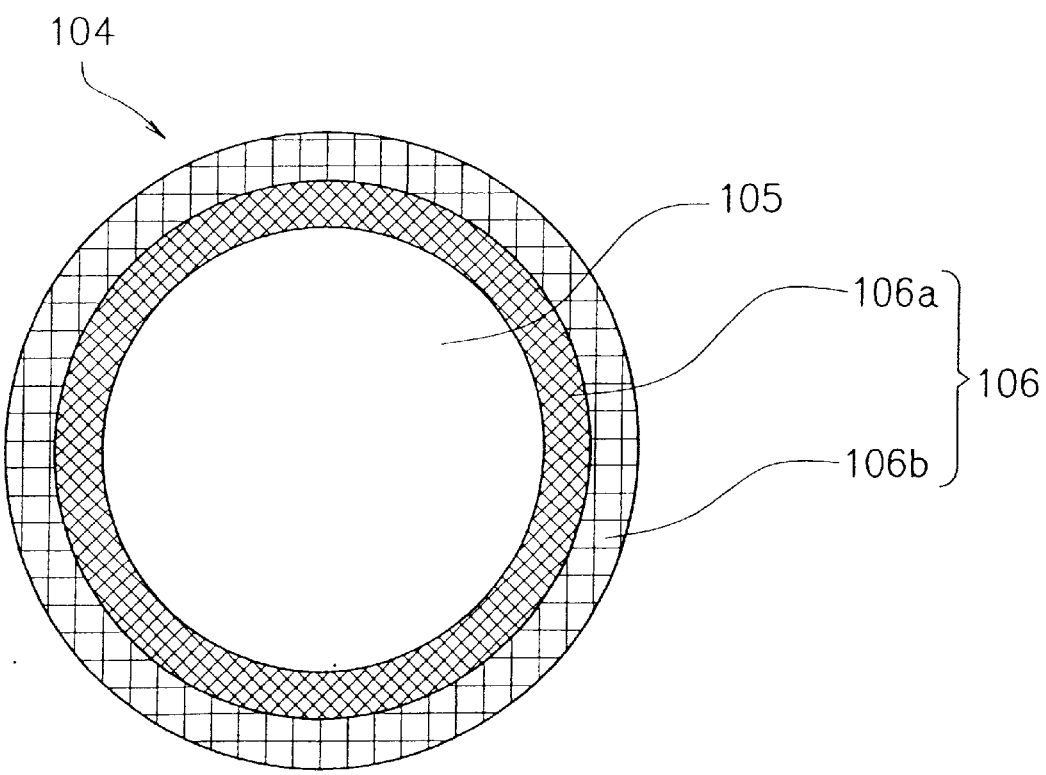

As the collecting electrode 104 used in the present invention, it is possible to use a collecting electrode having such configuration as shown in FIG. 3(a) or FIG. 3(b). The collecting electrode shown in FIG. 3(a) comprises a metal wire 105 and a single electrically conductive coat layer 106 formed thereon. The collecting electrode shown in FIG. 3(b) comprises a metal wire 105 and two electrically conductive coat layers 106a and 106b sequentially stacked on the surface of the metal wire 105.

The metal wire 105 may be a metal wire which is commercially available. In addition, the metal wire should preferably be a metal wire which is made of a metal having a resistivity lower than $10^{-4}$ $\Omega$cm, such as copper, silver, gold, platinum, aluminum, molybdenum, or tungsten. Of these metals, copper, silver, and gold are desirable because of low resistivity. The metal wire may be coated with a thin metal film for corrosion prevention, oxidation prevention, better adhesion to the electrically conductive resin, and improved electrical conduction. Such thin metal film may be formed of a noble metal such as gold, silver, palladium, or silver-palladium alloy, or a metal such as nickel, tin, or the like, which are superior in corrosion resistance. Of these metals, gold, silver, and tin are desirable for the thin metal film because of their good moisture resistance. Plating or cladding may be used to form the thin metal film.

The metal wire may have a round cross section or a square cross section as desired. The diameter of the metal wire should be selected so that the sum of resistance loss and shadow loss is minimal. To be concrete, the metal wire is preferred to comprise a copper wire having a diameter of 25 µm to 1 mm or an enameled wire stipulated in JIS C3202. The copper wire having a diameter from 25 µm to 200 µm is more desirable to obtain a photovoltaic element having a good photoelectric conversion efficiency. A copper wire having a diameter of less than 25 µm is liable to breakage, causing difficulties in its production and also causing a large electric loss. A copper wire having a diameter of beyond 200 µm is liable to cause a large shadow loss and provide irregularities at the surface of the photovoltaic element, where it will be necessary to thicken a surface covering material of EVA (ethylene-vinyl acetate copolymer) formed in order to protect the photovoltaic element.

The above-mentioned metal wire can be formed by any known wire drawing machine. In the case of a hard metal wire passed through the wire drawing machine, it may be followed by annealing in any known method to reduce the hardness so that it is extendable and has flexibility, depending on the situation involved.

The electrically conductive coat layer 106 shown in FIG. 3(a) has a single-layered structure and it may be formed of a thermosetting electrically conductive adhesive or a thermoplastic electrically conductive adhesive. These adhesives become to function such that they mechanically and electrically connect the collecting electrode and the substrate of the photovoltaic element when thermo-compressed.

The electrically conductive coating layer 106 shown in FIG. 3(b) has a two-layered structure comprising the first coat layer 106a and the second coat layer 106b. The first coat layer 106a may be formed of a thermosetting electrically conductive adhesive, where it protects the electrode metal and performs mechanical and electrical connection. It also prevents migration of the electrode metal and prevents current from flowing from the collecting electrode into defective parts in the photovoltaic element. The second coat layer 106b may also be formed of a thermosetting electrically conductive adhesive, where when thermo-compressed, it functions to mechanically and electrically connect the collecting electrode and the substrate of the photovoltaic element. In a preferred embodiment, the electrically conductive adhesive for the second coating layer 106b is left uncured after the coating step and cured after the bonding step is completed.

The electrically conductive coating layer 106 is formed of an electrically conductive adhesive comprising a polymer resin and electrically conductive particles dispersed therein.

In any case, the electrically conductive adhesive is necessary to have a resistivity which is negligibly low for collecting current generated by the photovoltaic element but is adequately high to prevent shunting. To be concrete, the resistivity should be in a range of 0.1 to 100 Ωcm. With a resistivity lower than 0.1 Ωcm, the coat layer does not function to prevent shunting; with a resistivity higher than 100 Ωcm, the coat layer has a large resistance loss.

The electrically conductive particles comprise pigments for imparting conductivity. As such pigment, there can be mentioned carbon black, graphite, $In_2O_3$, $TiO_2$, $SnO_2$, ITO, and ZnO. Besides, oxide semiconductor materials comprising these oxides added with adequate dopants are also usable. These materials can be used also in a photovoltaic element having a thin-film semiconductor layer on account of their weak tendency toward migration. Of these pigment materials, when electrically conductive particles of carbon black or graphite are used, there is an advantage in that the resulting adhesive itself is black-colored to readily absorb a laser beam, making the metal wire to be exposed easily in the subsequent step which will be described later.

The electrically conductive particles should have an average particle size smaller than the thickness of the coat layer to be formed. However, excessively small particles do not have a desired resistivity because there are provided a large number of particle-to-particle contact points that increase the total resistance. For this reason, the electrically conductive particles are preferred to have an average particle size in a range of 0.02 to 15 µm. It is possible to mix two or more kinds of electrically conductive particles in order to properly control the resistivity of the electrically conductive adhesive and also in order to properly control the dispersion magnitude in the electrically conductive resin.

The electrically conductive particles and the polymer resin are mixed at an adequate mixing ratio so as to obtain a desired resistivity. As the amount of the former increases, the coat layer formed has a low resistivity but it is unstable in term of coating the metal wire because the resin content is small. Conversely, as the amount of the polymer resin increases, the resistivity of the coat layer formed increases because there are less chances for the electrically conductive particles to come into contact with one another therefore, an adequate mixing ratio should be selected according to the physical properties of the polymer resin and electrically conductive particles and physical properties desired for the coat layer formed. To be concrete, the electrically conductive particles should be used in an amount of 5 to 95% by volume.

The polymer resin is preferred to comprise a polymer resin which makes it possible to readily form a film coat on the metal wire and has good workability, flexibility, and weatherability. It may be selected from the group consisting of thermosetting resins and thermoplastic resins.

Preferred examples of such thermosetting resin include polyurethane resin, epoxy resin, phenolic resin, polyvinyl formal, alkyd resin, and modified resins thereof. Of these resins, polyurethane resin, epoxy resin, and phenolic resin, which are used as an insulating coating material for enameled wires, and which are flexible and superior in productivity.

Preferred examples of such thermoplastic resin include butyral resin, phenoxy resin, polyamide resin, polyamide-imide resin, melamine resin, acrylic resin, styrene resin, polyester resin, and fluorocarbon resin. Of these resins, butyral resin, phenoxy resin, polyamide resin, and polyamideimide resin are preferarable because they have good flexibility, moisture resistance, and adhesion. They are preferably used in the formation of the collecting electrode for the photovoltaic element.

The electrically conductive adhesive may be incorporated with an additive (such as coupling agent) to improve the adhesion to a metal.

It is possible to make the electrically conductive coating layer 106 have a desired thickness, preferably in a range of 5 µm to 30 µm. When the thickness is smaller than 5 µm, it is difficult to make the coat layer have an uniform thickness, where the coat layer is liable to suffer from pin-holes, and it is poor in adhesion. When the coating layer has a thickness of beyond 30 µm, there is a tendency in that an extremely large shadow loss is provided.

Metal Bus-bar

The metal bus-bar used in the present invention functions to collect the current flowing through the collecting electrode at one end. Consequently, the metal bus-bar is necessary to be formed of a metallic material which has a low resistivity and can be readily acquired.

An example of such metallic material is copper, which is inexpensive and easy to work with. A copper bus-bar may be coated with a thin metal layer to prevent the bus-bar from being corroded and also from being oxidized Such thin metal layer may be formed of a noble metal such as gold, silver, palladium, or silver-palladium alloy, or a metal such as nickel, solder, tin, or the like, which are superior in corrosion resistance The thin metal layer may be readily formed by vapor deposition, plating, cladding, or the like.

The metal bus-bar is preferred to have a thickness in a range of 50 to 200 µm. By making the metal bus-bar have a thickness of more than 50 µm, it is possible to secure have a sectional area enough to comply with a current density generated by the photovoltaic element and it is also possible for the metal bus-bar to have adequate mechanical strength to be used as a junction material in practice. The thicker the metal bus-bar, the lower the resistance loss it has. However, the metal bus-bar thinner than 200 µm permits the surface covering material to achieve smooth covering.

It is possible that only one metal bus-bar is provided. But this is not limitative. As many metal bus-bars as necessary may be provided depending on the configuration of the photovoltaic element. It is preferred that the metal bus-bar has a length which is substantially the same as that of the photovoltaic element.

Photovoltaic Element

There is no particular limitation for the photovoltaic element to which the present invention is applied. The present invention can be adopted in single-crystalline solar cells, thin-film single-crystalline solar cells, polycrystalline solar cells, thin-film polycrystalline solar cells, and amorphous solar cells. Besides, the present invention can be adopted also in other solar cells such as Schottky type solar cells.

The present invention fully provides its advantages especially when adopted in a thin film series photovoltaic element which is vulnerable to metal migration which occurs when the electrically conductive paste is forced out.

As a typical example of such photovoltaic element, there can be mentioned an amorphous silicon solar cell in which a metal wire is often used as the collecting electrode. Description will be made of such amorphous silicon solar cell with reference to FIGS. 4(a) to 4(c).

Figure 4:
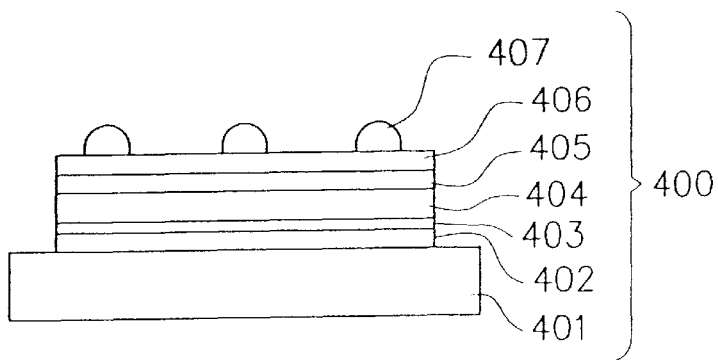
FIGS. 4(a) to 4(c) are schematic cross-sectional views respectively showing an amorphous silicon solar cell (photovoltaic element) to which the present invention is favorably applied.
Figure 4:
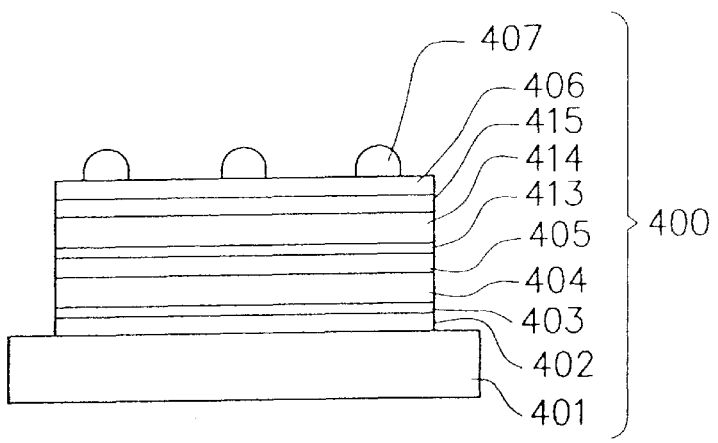
Figure 4:
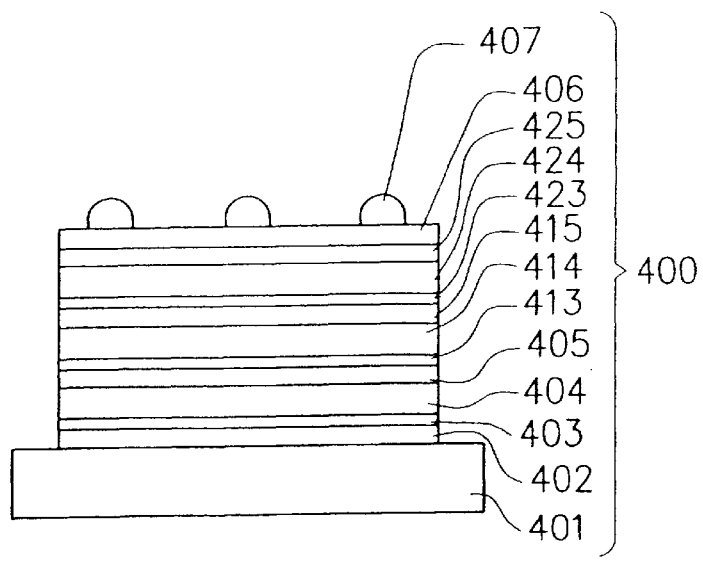

FIGS. 4(a), 4(b), and 4(c) are schematic cross-sectional views respectively illustrating an amorphous silicon solar cell 400 (or an amorphous silicon photovoltaic element) which is structed such that light is impinged through the surface opposite to the substrate in FIGS. 4(a) to 4(c), there are shown a substrate 401, a lower electrode 402, n-type semiconductor layers 403, 413, and 423, i-type semiconductor layers 404, 414, and 424, p-type semiconductor layers 405, 415, and 425, an upper electrode 406 comprising a transparent conductive film, and a collecting electrode 407 (or a grid electrode).

The substrate 401 serves to mechanically support semiconductor layers in the case of an thin film solar cell comprising an amorphous silicon material. The substrate also functions as an electrode. Therefore, the substrate 401 is necessary to be formed of an electrically conductive material or an electrically insulating material which withstands a high temperature at which the semiconductor layers are formed.

Examples of the electrically conductive material for the substrate include thin plates made of metals such as Fe, Ni, Cr, Al, Mo, Au, Nb, Ta, V, Ti, Pt, Pb, and Ti, or alloys thereof such as brass and stainless steel, and composite members made of these metallic materials.

Besides, carbon sheets and galvanized steel sheets, and composite members of these are also mentioned.

Examples of the electrically insulating material for the substrate include films made of heat-resistant synthetic resins such as polyester, polyethylene, polycarbonate, cellulose acetate, polypropylene, polyvinyl chloride, polyvinylidene chloride, polystyrene, polyamide, polyimide, and epoxy resin; composite members of these resin films, and composite members comprising any of said resin films and a glass fiber member, a carbon fiber member, a boron fiber member, or a metal fiber member. On the surface of any of these thin metal members and resin members as the substrate, it is possible to provide a thin metal coating film made of a metallic material which is different from the constituent and/or a thin insulative coating film made of $SiO_2$, $Si_3N_4$, $Al_2O_3$, or the like, formed by sputtering, vapor deposition, or plating. Separately, the substrate may comprise a member made glass or ceramics.

The lower electrode 402 functions to output electric power generated by the semiconductor layers (403, 404, 405, 413, 414, 415, 423, 424, and 425). The lower electrode 402 is required to have an ohmic contact with the semiconductor layer 403. The lower electrode 402 may be formed of a metal such as Al, Ag, Pt, Au, Ni, Ti, Mo, W, Fe, V, Cr, or Cu, any of alloys of these metals such as nichrome and the like, or a transparent electrically conductive oxide (TCO) such as $SnO_2$, $In_2O_3$, ZnO, or ITO. The surface of the lower electrode 402 is preferred to be smooth; however, it may be textured if irregular reflection is desirable. In the case where the substrate 401 is electrically conductive, the lower electrode may be omitted. The lower electrode 402 may be formed by any known method such as plating, vapor deposition, and sputtering.

The amorphous semiconductor layer may be designed to have one or more p-n or p-i-n junctions. Specifically, the amorphous semiconductor layer may be designed to have, for instance, a single cell structure having a p-i-n junction, comprising an n-type semiconductor layer 403, an i-type semiconductor layer 404 and a p-type semiconductor layer 405 being stacked, as shown in FIG. 4(a); a double cell structure having two p-i-n junctions, comprising a first p-i-n junction cell comprising an n-type semiconductor layer 403, an i-type semiconductor layer 404 and a p-type semiconductor layer 405 being stacked and a second p-i-n junction cell comprising an n-type semiconductor layer 413, an i-type semiconductor layer 414 and a p-type semiconductor layer 415 being stacked, as shown in FIG. 4(b); or a triple cell structure having three p-i-n junctions, comprising a first p-i-n junction cell comprising an n-type semiconductor layer 403, an i-type semiconductor layer 404 and a p-type semiconductor layer 405 being stacked, a second p-i-n junction cell comprising an n-type semiconductor layer 413, an i-type semiconductor layer 414 and a p-type semiconductor layer 415 being stacked, and a third p-i-n junction cell comprising an n-type semiconductor layer 423, an i-type semiconductor layer 424 and a p-type semiconductor layer 425 being stacked, as shown in FIG. 4(C). The semiconductor material constituting the i-type semiconductor layer (404, 414, 424) can include amorphous silicon (a-Si) semiconductor materials, and group IV series amorphous semiconductor materials and group IV alloy series amorphous semiconductor materials such as a-SiGe, a-SiC, and the like. The amorphous semiconductor layer may be formed by any known method such as vapor deposition, sputtering, high-frequency plasma CVD, microplasma CVD. ECR, thermal CVD, and LPCVD. As the film-forming apparatus adopted for the formation of the amorphous semiconductor layer by any of the above-mentioned methods, there can be mentioned, for example, a batch type film-forming apparatus, and a continuous film-forming apparatus.

The upper electrode 406 is necessary in the case where the sheet resistance is high as in the case of an amorphous silicon material. The upper electrode is required to be transparent so that it transmits light. It may be formed of a metal oxide such as $SnO_2$, $In_2O_3$, ZnO, CdO, $CdSnO_4$, or ITO.

Production Process

An example of the production process of the photovoltaic element in the present invention, description will be made of a process of producing an amorphous silicon solar cell with reference to FIGS. 5(a) to 5(f). FIGS. 5(a) to 5(f) are schematic plan views of the amorphous silicon solar cell (viewed from the light incident side).

Step (a): A photovoltaic element 501 of a desired size is provided. The photovoltaic element 501 comprises a lower electrode, a photovoltaic layer (a semiconductor layer), and an upper electrode (a transparent electrically conductive layer) which are sequentially stacked on a electrically conductive surface of a substrate.

Step (b): The transparent electrically conductive layer of the photovoltaic element is partly removed to form a so-called etching line 502. The etching line 502 protects the element efficiency from being impaired by short-circuited portions which might exist in the periphery of the photovoltaic element. It may be omitted if short-circuited portions are absent or negligible.

At each of the opposite side end portions of the photovoltaic element 501, an insulating member 503 comprising, for example, a double coated adhesive tape is arranged. The insulating member 503 is arranged for the purpose of preventing a collecting electrode or a metal bus-bar, which are provided at a later stage, from coming into contact with the short-circuited portions of the photovoltaic element 501. The insulating member 503 may be omitted if there is no possibility of short-circuiting, as in the case of the etching line.

Step (c): Metal wires covered by a electrically conductive coat layer as the collecting electrode 504 are arranged on the transparent electrically conductive layer as the upper electrode at a prescribed interval. At this time, the collecting electrode 504 is fixed on the insulating member 503 at each of the opposite side end portions of the photovoltaic element 501.

Step (d): Prescribed portions of the metal wires covered by the electrically conductive coat layer as the collecting electrode 504 on which metal bus-bars are arranged in the subsequent step are irradiated with a laser beam so that the electrically conductive coating layer is removed and the metal wire is exposed. The exposed portion is indicated by a reference numeral 505.

The laser beam should have an adequate output intensity so that it is sufficient to remove the electrically conductive coating layer but is not excessive to damage the insulating member 503 or melt the metal wires. Under adequate condition, it is possible to selectively remove prescribed portions of the electrically conductive coating layer and to cause the metal wire surface to be exposed neatly.

The step of removing the electrically conductive coating layer is usually carried out after the wires covered by the electrically conductive coat layer are attached to the photovoltaic element. Alternatively, it is possible to attach the wires covered by the electrically conductive coat layer to the photovoltaic element after they have undergone the step of removing the electrically conductive coating layer in a different place.

Step (e): An electrically conductive paste 506 is dotted in an elliptical form on each of the portions 505 where the metal wire is exposed. (This dotting step has been previously described.)

Step (f): A metal bus-bar 507 is arranged on the electrically conductive paste 506. The bus-bar is heated while being pressed, whereby the electrically conductive paste 506 is cured to form connections. Then, the entire surface of the photovoltaic element is heated while compressing, whereby the electrically conductive coat layers of the metal wires are cured and bonded to the transparent electrically conductive layer as the upper electrode.

The above-mentioned steps yield the photovoltaic element of the present invention, with the electrically conductive paste 506 being applied accurately onto the metal wires regardless of the positioning accuracy, and without the electrically conductive paste 506 being forced out.

In the following, the present invention will be described in more detail with reference to examples. It should be understood that these examples are only for illustrative purposes and not intended to restrict the scope the present invention.

First, description will be made of the collecting electrode used in the following Examples and Comparative Examples are described.

Preparation of Collecting Electrode

A collecting electrode comprising a metal wire (105) whose surface is covered by a two-layered coat (106) comprising a first electrically conductive coat layer (106a) and a second electrically conductive coat layer (106b) as shown in FIG. 3(b) was prepared.

As the metal wire 105, there was provided a silver-clad copper wire having a diameter of 100 μm (the copper wire has a diameter of 98 μm and the silver cladding layer has a thickness of 1 μm).

The exterior surface of the metal wire 105 was coated with a carbon-containing polyurethane paste (in-house product) at a thickness of 5±1 μm to form a first coat layer 106a. The first coat layer 106a was completely cured by heating it at 280° C. for 1 minute in an IR oven.

On the exterior surface of the first coat layer 106a, another carbon-containing polyurethane paste (in-house product) was coated at a thickness of 20±1 μm to form a second coat layer 106b on the first coat layer 106a. The second coat layer 106b was dried at 120° C. for 1 minute so as to evaporate the solvent therefrom. This condition is not high enough to activate the curing agent in the paste but is high enough to take away tackiness from the second coating layer In this way, there was prepared a collecting electrode having a diameter of 150 μm.

EXAMPLE 1

In this example, there was prepared an amorphous solar cell A (an amorphous photovoltaic element) having a p-i-n junction type triple cell structure as shown in FIG. 4(c) in the following manner.

A completely degreased and cleaned substrate 401 made of SUS 430BA stainless steel was placed in a DC sputtering apparatus (not shown), where on the substrate 401, there were sequentially formed a 450 nm thick Ag film and a 1000 nm thick ZnO film, whereby a two-layered lower electrode 402 was formed on the substrate. The substrate 401 having the lower electrode 402 formed thereon was taken out from the DC sputtering apparatus and it was placed in a microwave plasma CVD apparatus (not shown), where on the lower electrode 402, there were sequentially formed a bottom cell comprising an i-type amorphous silicon semiconductor layer 403, an n-type amorphous silicon-germanium semiconductor layer 404, and a p-type amorphous silicon semiconductor layer 405; a middle cell comprising an n-type amorphous silicon semiconductor layer 413, an i-type amorphous silicon-germanium semiconductor layer 414, and a p-type amorphous silicon semiconductor layer 415: and a top cell comprising an n-type amorphous silicon semiconductor layer 423, an i-type amorphous silicon-germanium semiconductor layer 424, and a p-type amorphous silicon semiconductor layer 425, whereby an amorphous semiconductor layer having a triple cell structure with three p-i-n junctions was formed on the lower electrode 402 of the substrate 401. The substrate 401 having the amorphous semiconductor layer formed thereon was taken out from the microwave plasma CVD apparatus and it was placed in a sputtering apparatus (not shown), where a 70 nm thick ITO film as the transparent electrically conductive layer 406 which functions also as a reflection preventive layer was formed on the p-type semiconductor layer 425 of the amorphous semiconductor layer.

Thus, there was obtained a solar cell substrate (a photovoltaic element) having the lower electrode, the amorphous semiconductor layer (as the photovoltaic layer) and the upper electrode (the transparent electrically conductive layer) sequentially formed thereon. Using this solar cell substrate, there was prepared a solar cell (a photovoltaic element) having such configuration as shown in FIGS. 5(*a*) to 5(*f*).

Figure 5:
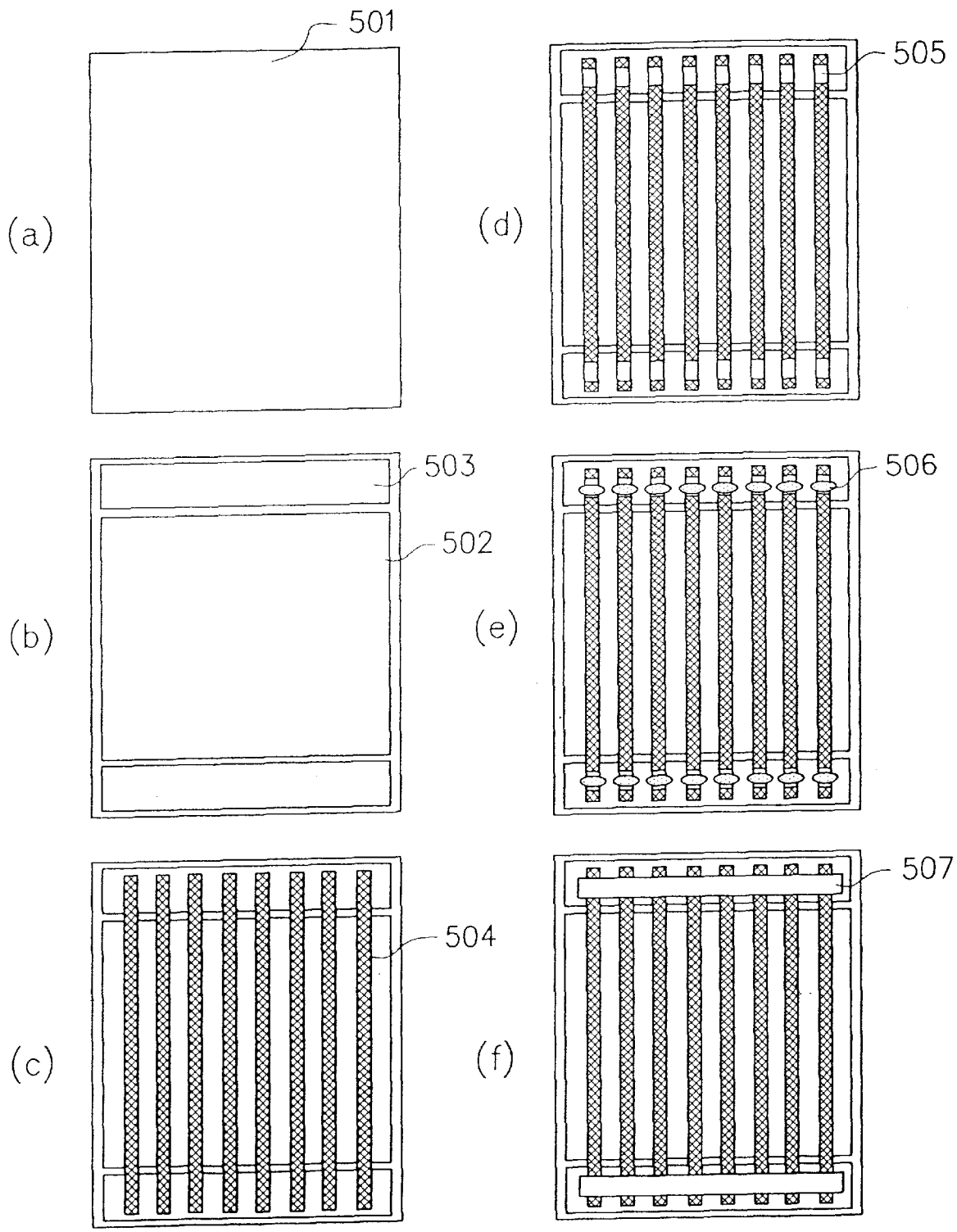
FIGS. 5(a) to 5(f) are schematic diagrams for explaining a process for producing a photovoltaic element according to the present invention.
Figure 6:
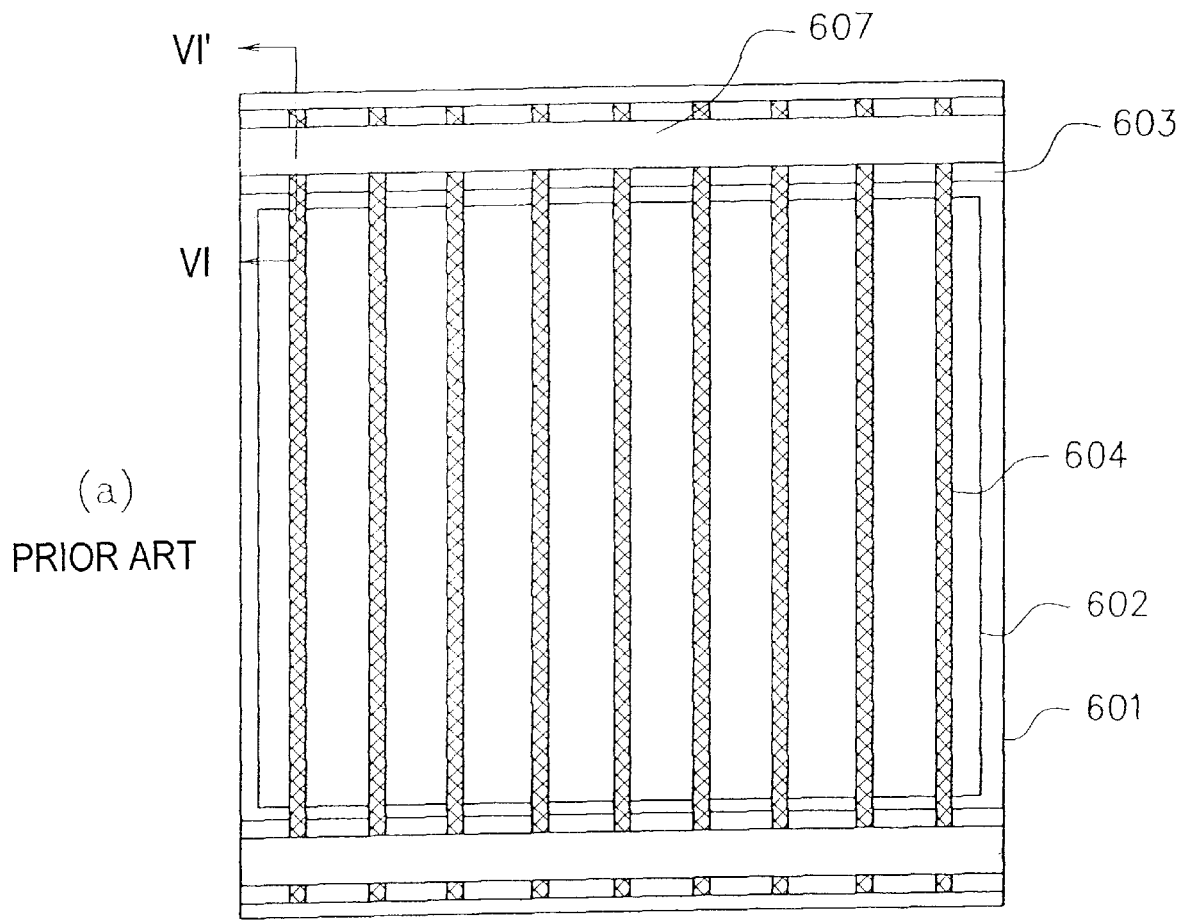
FIGS. 6(a) and 6(b) are schematic diagrams showing a conventional photovoltaic element.
Figure 6:
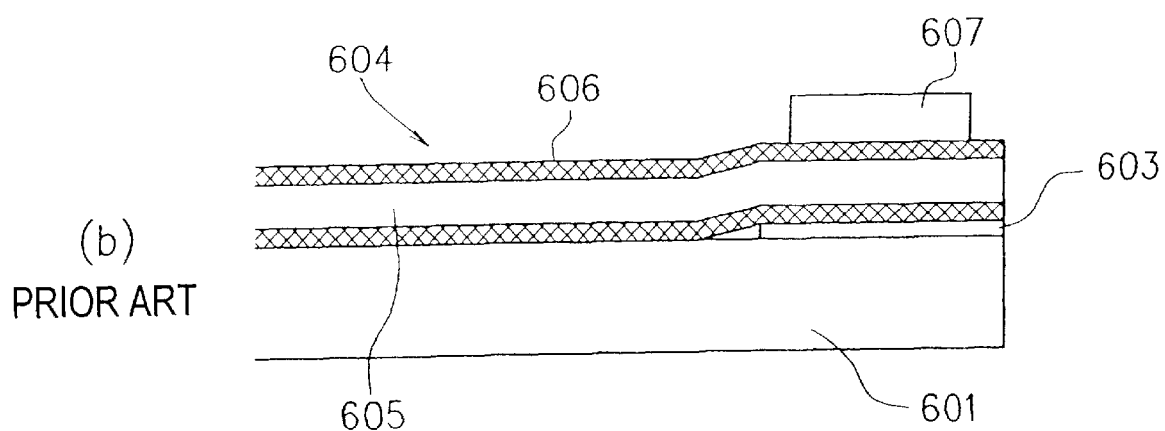

The solar cell substrate (501)[see, FIG. 5(*a*)] was subjected to an etching treatment using an etching paste composed mainly of ferric chloride and a conventional screen printing machine, where an unnecessary peripheral portion of the transparent electrically conductive layer of the solar cell substrate was removed so that the cell has an active area of 900 cm$^2$ (30 cm×30 cm). Then, an insulating member 503 comprising a double-coated adhesive tape which comprises a polyimide base member sandwiched between a pair of adhesive tapes having a thickness of 100 μm was attached to each of the opposite side end etched portions (outside the active area) as shown in FIG. 5(*b*). Successively, the foregoing collecting electrode was cut to obtain 50 collecting electrode wires having a length of about 30 cm. These collecting electrode wires 504 were arranged at an equal interval of 6 mm as shown in FIG. 5(*c*), by using a wiring machine, where the opposite end portions of each of the current collecting electrode wires were fixed by virtue of the tackiness of the double-coated adhesive tapes. The accuracy of the wire arrangement was ±0.2 mm in terms of the σ value.

Thereafter, the collecting electrode wires lying on the insulating members (the double-coated adhesive tapes) situated on the opposite end sides were irradiated with a laser beam directed downward, whereby prescribed opposite end portions (of a length of 2 mm) of the coat layer of each collecting electrode wire were removed to expose the silver-clad copper wire was exposed, as shown in FIG. 5(*d*). As the laser beam, there was used a laser beam generated by a Q-switch YAG laser, and the laser beam was irradiated under conditions 30 W for the output power, 12 kHz for the pulse frequency, and 1200 mm/second for the scanning speed.

Then, a commercially available silver paste was dotted on the exposed silver-clad wire portions 505 of each collecting electrode wire as shown in FIG. 5(*e*). This dotting was carried out automatically by using a conventional robot dispenser equipped with an elliptical nozzle having a major axis of 2 mm and a minor axis of 0.2 mm. The dispenser was controlled so as to deliver a doting amount of 0.5 mg for each dot. Each of the doted portions was found to have an elliptical shape 506 which is about 2.1 mm long in a direction perpendicular to the metal wire and about 0.4 mm wide in a direction parallel to the metal wire.

From above the dotted portions on each of the opposite end sides, a metal bus-bar 507 comprising a 100 μm thick silver-plated copper foil was placed in parallel to the double-coated tape as shown in FIG. 5(*f*). The entire assembly was thermo-compressed by using a conventional thermo-compression apparatus, where the current collecting wires were bonded and fixed to the transparent electrically conductive layer in the active area and the dotted silver pastes were cured at the metal bus-bar portions to bond and fix the metal bus-bars and the collecting electrode wires. Thus, there was obtained an amorphous solar cell (an amorphous photovoltaic element).

By repeating the above procedures, there were obtained ten amorphous solar cell samples A.

Evaluation

For the resultant 10 amorphous solar cell samples A, evaluation was conducted as will be described below.

1. For the 1000 connection portions of the 10 solar cell samples, examination was conducted whether or not the silver paste is forced out from the metal bus-bar using a CCD microscope. As a result, it was found that all the 1000 connection portions are free of a defect where the silver paste is forced out.

2. For each of the 10 solar cell samples, evaluation was conducted with respect to the photoelectric conversion efficiency by using a solar simulator comprising a pseudo sunlight source with a AM 1.5 solar spectrum which emits a light quantity of 100 mW/cm$^2$. As a result, the 10 solar cell samples were found to have a photoelectric conversion efficiency of 12.8±0.1%.

3. For the 10 solar cell samples having subjected to the evaluation in the above 2, their 1000 connection portions were examined in the same manner as in the above 1. As a result, it was found that all the 1000 connection portions are free of a defect where the silver paste is forced out to disconnect the metal bus-bar from the collecting electrode wire.

As being apparent from the above results, it is understood that the production process of the present invention makes it possible to mass-produce a solar cell (or a photovoltaic element) having a stable electrode structure with sturdy connections without the silver paste being forced out.

Comparative Example 1

Figure 8:
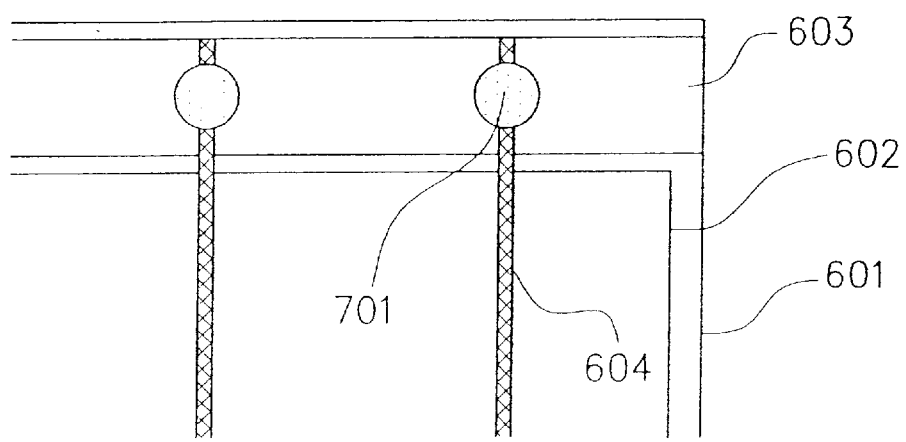
FIGS. 8(a) and 8(b) are enlarged schematic diagrams showing a conventional photovoltaic element with dotting.
Figure 8:
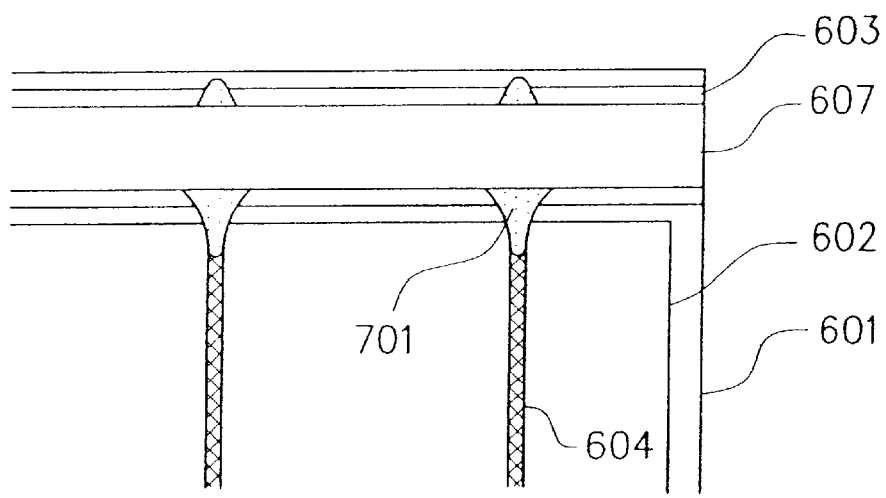

The procedures of Example 1 were repeated, except that instead of the ellipticalal dots, round dots as indicated by reference numeral 701 in FIG. 8(*a*) were formed by using a round nozzle instead of the elliptical nozzle, to obtain 10 amorphous solar cell samples B.

The round nozzle has a diameter of 2 mm. It delivered circular dots having a diameter of 2.1 mm. The dotted amount of each dot was 0.5 mg as in Example 1.

Evaluation

The result 10 solar cell samples B were evaluated in the same manner as in Example 1.

1. The 10 solar cell samples were examined for their 1000 connection portions whether or not they have defects where the silver paste is forced out from the metal bus-bar, using a CCD microscope. As a result, each of the 1000 connection portions was found to have a defect where the silver paste is forced out.

2. Each of the 10 solar cell samples was evaluated with respect to the photoelectric conversion efficiency in the same manner described in the evaluation 2 of Example 1.

As a result, the five solar cell samples were found to have a photoelectric conversion efficiency of 12.8±0.1%, but the photoelectric conversion efficiencies of the remaining five samples were found to be 12.6%, 12.4%, 12.4%, 12.2%, and 12.0%, respectively, which are inferior. A probable reason for this variation in the photoelectric conversion efficiency is considered such that the good five solar cell samples were saved from the squeezed silver paste coming into contact with pin-holes present in the active area but the inferior five solar cell samples permitted the squeezed silver paste to come into contact with pin-holes present in the active area thereby to decreasing the shunt resistance, resulting in a reduction in the photoelectric conversion efficiency.

3. The connection state in each of the 1000 connection portions of the 10 solar cell samples having been subjected to the evaluation in the above 2 was examined by peeling the metal bus-bar off from the collecting electrode wire and observing by means of a CCD microscope. As a result, it was found that the collecting electrode wire and the metal bus-bar are joined by the silver paste in each of the 1000 connection portions.

The above results suggest that the slightly larger round dotting permits stable bonding but makes the silver paste to be forced out, which leads to short circuiting.

Comparative Example 2

The procedures of Comparative Example 1 were repeated, except that round dots were formed by using a round nozzle having a diameter of 0.3 mm, to obtain 10 amorphous solar cell samples C.

The round nozzle delivered circular dots having a diameter of about 0.35 which is smaller than the diameter in Comparative Example 1. The dotted amount for each dot was 0.5 mg as well as in Comparative Example 1.

Evaluation

The resultant 10 solar cell samples C were evaluated in the same manner as in Example 1.

1. The ten samples were examined for their 1000 connection portions whether or not they have defects where the silver paste is forced out from the metal bus-bar, using a CCD microscope. As a result, each of the 1000 connection portions was found to be free of a defect where the silver paste is forced out.

2. Each of the 10 solar cell samples was evaluated with respect to the photoelectric conversion efficiency in the same manner described in the evaluation 2 of Example 1. As a result, the photoelectric conversion efficiencies of the 10 solar cell samples were found to be 12.6%, 12.5%, 12.3%, 12.3%, 12.1%, 11.9%, 118%, 11.8%, 11.6%, and 11.3%, respectively. This results indicate that none of the 10 solar cell samples exhibits a satisfactory photoelectric conversion efficiency.

In order to find out a reason why every solar cell sample is inferior in terms of the photoelectric conversion efficiency, the series resistance of each of the 10 solar cell samples was examined. As a result, the series resistance of each of the 10 solar cell samples was found to be undesirably high. Thus, a main reason why each of the 10 solar cell samples is inferior in terms of the photoelectric conversion efficiency is considered such that the joining between the collecting electrode wire and the metal bus-bar by the silver paste was not conducted in a desired connection state in the connection portions and this situation heightens the series resistance, resulting in a reduction in the photoelectric conversion efficiency.

For the confirmation purpose, the connection state in each of the 1000 connection portions was examined by peeling the metal bus-bar off from the wire and observing by means of a DDC microscope. As a result, each of the 10 solar cell samples was found to have several connection portions where the collecting electrode wire and the metal bus-bar are not joined.

From the results obtained in Comparative Examples 1 and 2, it is understood that in the case where slightly smaller round dotting is conducted, although there is a tendency in that the silver paste is not forced out, but a plurality of connection portions where the collecting electrode wire and the metal bus-bar are not joined are occurred, resulting in a reduction in the photoelectric conversion efficiency.

Figure 9:
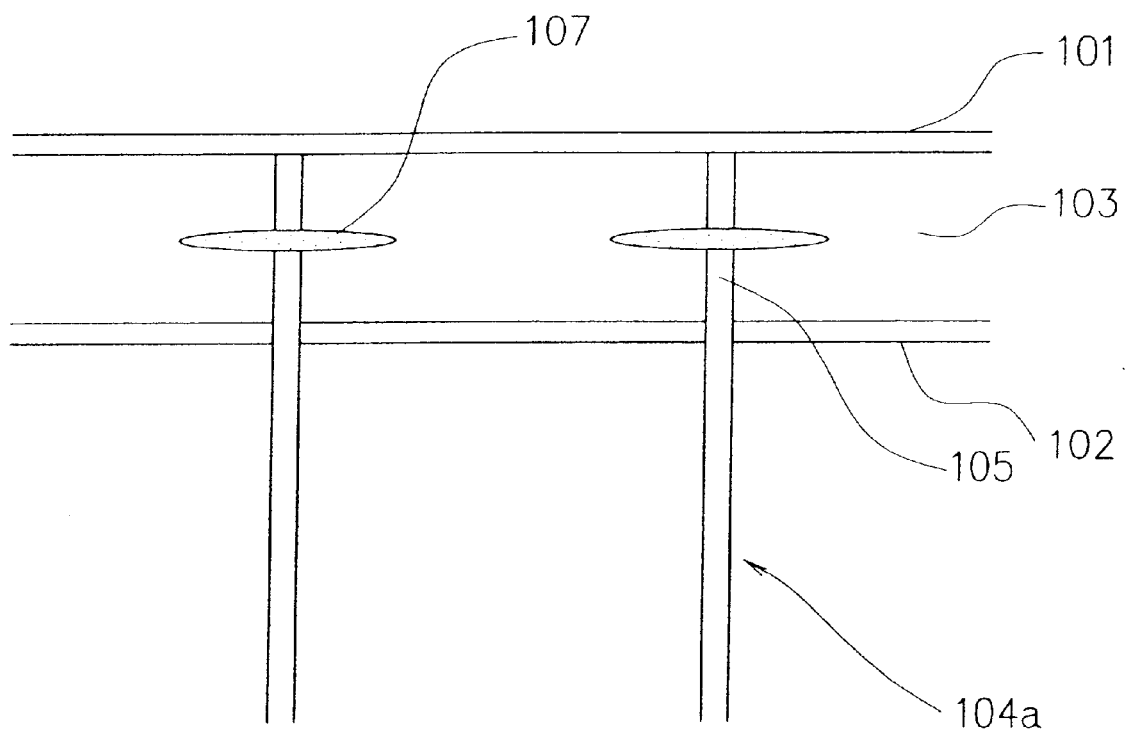
FIG. 9 is a schematic diagram showing a photovoltaic element with elliptical dotting according to the present invention.

In the meantime, the present invention is applicable also to an electrode structure where the collecting electrode has no electrically conductive coat layer (see, reference numeral 104a in FIG. 9), without the electrically conductive paste being forced out.

As being apparent from the above description, the production process according to the present invention makes it possible to mass-produce a stable solar cell (a stable photovoltaic element) in which the metal bus-bar is firmly joined with the metal wires through the electrically conductive paste without the electrically conductive paste being forced out.

What is claimed is:

1. A process for producing a photovoltaic element having a collecting electrode comprising a metal wire and a bus-bar which are arranged on the surface of said photovoltaic element, said collecting electrode being connected to said bus-bar with an electrically conductive paste, said process comprising the steps of:

(a) dotting an electrically conductive paste onto said collecting electrode such that a dotted electrically conductive paste has an elliptical form whose major axis and minor axis are respectively perpendicular to and parallel to a lengthwise direction of said metal wire of said collecting electrode;

(b) placing said bus-bar on said electrically conductive paste; and (c) pressing with heat said bus-bar, thereby curing said electrically conductive paste.

2. The process according to claim 1, wherein the dotting step (a) is carried out by delivering said electrically conductive paste from an elliptical nozzle.

3. The process according to claim 2, wherein the dotting step (a) is carried out by delivering said electrically conductive paste from said nozzle while moving said nozzle relatively to said photovoltaic element.

4. The process according to claim 1, wherein said collecting electrode comprises said metal wire covered with an electrically conductive coat layer.

5. The process according to claim 4 which further comprises a step of removing a portion of said electrically conductive coat layer of the collecting electrode where said electrically conductive paste is dotted, said step being conducted before the dotting step (a).

6. The process according to claim 1, wherein said electrically conductive paste is composed of a polymer resin and electrically conductive particles.

* * * * *